US008860461B2

(12) United States Patent
Sofer et al.

(10) Patent No.: US 8,860,461 B2
(45) Date of Patent: Oct. 14, 2014

(54) VOLTAGE LEVEL SHIFTER, DECOUPLER FOR A VOLTAGE LEVEL SHIFTER, AND VOLTAGE SHIFTING METHOD

(75) Inventors: Sergey Sofer, Reshon Letzion (IL); Michael Priel, Hertzelia (IL); Dov Tyztkin, Ness Zyiona (IL)

(73) Assignee: Freescale Semiconductor, Inc., Austin, TX (US)

( * ) Notice: Subject to any disclaimer, the term of this patent is extended or adjusted under 35 U.S.C. 154(b) by 51 days.

(21) Appl. No.: 13/635,166

(22) PCT Filed: Apr. 22, 2010

(86) PCT No.: PCT/IB2010/051767
§ 371 (c)(1),
(2), (4) Date: Sep. 14, 2012

(87) PCT Pub. No.: WO2011/132023
PCT Pub. Date: Oct. 27, 2011

(65) Prior Publication Data
US 2013/0027082 A1 Jan. 31, 2013

(51) Int. Cl.
*H03K 19/0185* (2006.01)
*H03K 3/356* (2006.01)
(52) U.S. Cl.
CPC ................. *H03K 3/356113* (2013.01)
USPC .................. 326/80; 326/81; 326/68
(58) Field of Classification Search
USPC .............. 326/62–63, 68, 80–87; 327/333
See application file for complete search history.

(56) References Cited

U.S. PATENT DOCUMENTS

| 5,650,742 | A * | 7/1997 | Hirano .................. 327/333 |
| 7,501,856 | B2 | 3/2009 | Huang |
| 7,541,837 | B2 | 6/2009 | Lines |
| 7,567,112 | B2 | 7/2009 | Shen |
| 2006/0226873 | A1 | 10/2006 | De Sandre et al. |

OTHER PUBLICATIONS

International Search Report and Written Opinion correlating to PCT/IB2010/051767 dated Jan. 24, 2011.

* cited by examiner

Primary Examiner — Jany Richardson

(57) ABSTRACT

A voltage level shifter for translating a binary input signal representing a binary sequence to a binary output signal representing the same binary sequence. The voltage level shifter comprises an input port for receiving the binary input signal as an input voltage varying between a first input voltage level and a second input voltage level. An output port is connected to a node for outputting the binary output signal as an output voltage varying between a first output voltage level and a second output voltage level. A supply voltage node connectable to a voltage supply, can provide the second output voltage level. A first switch is arranged to couple the supply voltage node to the node and to decouple the supply voltage node from the node based on a voltage at the node. A feedback voltage loop is connected to the node for providing a feedback voltage based on the voltage at the node. A second switch is connected to the feedback voltage loop and arranged to couple the input port to the node based on a voltage at the input port and the feedback voltage. A decoupler and a voltage shifting method are also disclosed.

20 Claims, 6 Drawing Sheets

VOLTAGE LEVEL SHIFTER, DECOUPLER FOR A VOLTAGE LEVEL SHIFTER, AND VOLTAGE SHIFTING METHOD

FIELD OF THE INVENTION

This invention relates to a voltage level shifter, a decoupler for use with a voltage level shifter, and a method.

BACKGROUND OF THE INVENTION

Level shifter circuits are well-known and described for example in U.S. Pat. Nos. 7,501,856 B2, 7,567,112 B2 and U.S. Pat. No. 7,541,837 B2. However, quite generally in circuits for cross-domain transfer of timing-critical signals, a trade-off has to be made between propagation delay and energy consumption.

SUMMARY OF THE INVENTION

The present invention provides a voltage level shifter, a decoupler and a method as described in the accompanying claims.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
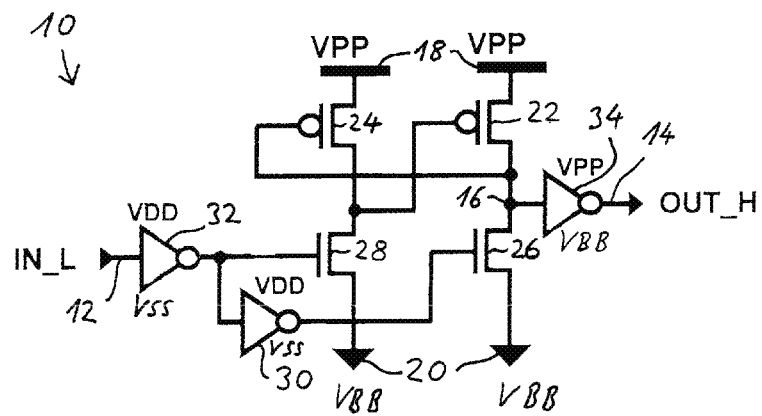
FIG. 1 schematically shows an example of an embodiment of a level shifter.

Referring to FIG. 1, there is shown an example of a level shifter. The voltage level shifter 10 serves to translate a binary input signal IN_L to a binary output signal OUT_H, the output signal to representing the same binary sequence as the input signal. The input signal is represented by an input voltage varying between a first input voltage level VSS to represent a first binary value and a second input voltage level VDD to represent a second binary value. The output signal is represented by an output voltage varying between a first output voltage level VBB to represent a second binary value and a second output voltage level VPP to represent the second binary value, although the level shifter may also be imple the first output voltage level VBB may alternatively represent the second binary value and a second output voltage level VPP to represent the second binary value. The level shifter 10 can thus be used to transfer a binary signal from an electronic circuit operating at high and low voltage levels VDD and VSS to another electronic circuit operating at voltage levels VPP and VBB. The high voltage levels VDD and VPP may differ or be the same. Similarly, the low voltage levels VDD and VBB may differ or be the same. In a typical scenario, VSS and VBB are equal and only VDD and VPP differ. The example circuit shown in FIG. 1 will operate best when VSS and VBB are substantially equal. The circuit can, however, be adapted (not shown) to make it suitable also for applications in which VSS and VBB differ markedly.

The level shifter 10 comprises an input port 12 for receiving the binary input signal IN_L and an output port 14 for delivering the binary output signal OUT_H. It further comprises cross-coupled PMOS transistors 22, 24 and NMOS transistors 26, 28. The circuit further comprises inverters 30 and 32 operating with the voltages VSS and VDD, and an inverter 34 operating with the voltages VBB and VPP.

The level shifter 10 operates as follows. When the input voltage at input port 12 is at VSS (low in the example), NMOS 28 and PMOS 22 are open (conductive), NMOS 26 and PMOS 24 are closed (non-conductive), and node 16 is at VPP (high in the example). Consequently, output port 14 is at VBB (low in the example). Analogously, when input port 12 is at VDD (high in the example), NMOS 26 and PMOS 24 are open, NMOS 28 and PMOS 22 are closed, and node 16 is at VBB (low). Output port 14 is then at VPP (high).

A benefit of the "double stage" structure comprising the two cross-coupled pull-up-pull-down stages of transistors 24, 28 and 22, 26 is that leakage currents between the two voltage domains (i.e. between the VSS-VDD domain and the VBB-VPP domain) are effectively suppressed. On the other hand, the structure typically involves a fairly important propagation delay, that is, a delay of the output signal OUT_H relative to the input signal IN_L.

Figure 2:
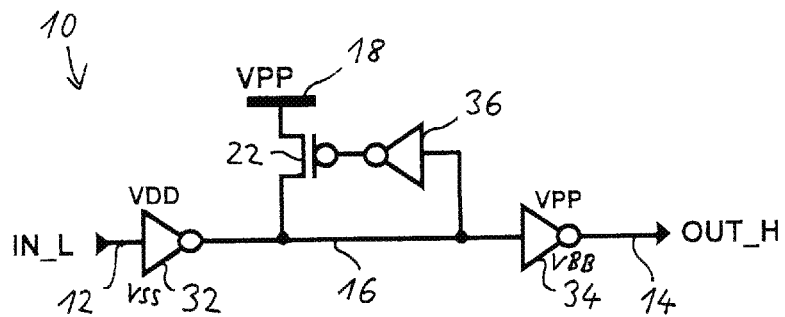
FIG. 2 schematically shows an example of another embodiment of a level shifter.

FIG. 2 illustrates another example of a lever shifter 10. The circuit comprises input port 12, output port 14, node 16, optional inverters 32 and 34, PMOS transistor 22 and inverter 36, and voltage node 18. The PMOS transistor 22 acts as a switch which couples the supply voltage node 18 to the node 16 and decouples the supply voltage node 18 from the node 16 based on the voltage at the node 16. When the input port 12 is at VSS (low), node 16 is high, the gate of PMOS 22 is low, PMOS 22 is open and output port 14 is at VBB (low). When input port 12 is at VDD (high), node 16 is at VBB, the gate of PMOS 22 is at VPP (high), PMOS 22 is closed, and output port 14 is at VPP (high). In both states there is a non-negligible electric current between the VSS-VDD domain and the VBB-VPP domain. If VSS and VBB are the same, there is a substantial current only when PMOS 22 is open. Like the circuit of FIG. 1, the exemplary circuit shown in FIG. 2 will operate in an optimal fashion when VSS and VBB are substantially equal. The circuit can be modified (not shown) for operating conditions in which VSS and VBB differ more significantly.

An advantage of the level shifter 10 shown in FIG. 2 as compared to the level shifter 10 discussed above with reference to FIG. 1 is its shorter delay. However, the leakage current which occurs at least during one state of the circuit involves higher energy consumption and is therefore undesired.

Figure 3:
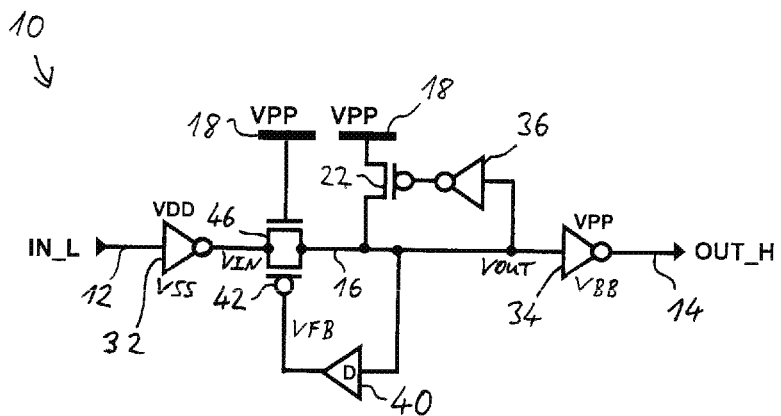
FIG. 3 schematically shows an example of yet another embodiment of a level shifter.

FIG. 3 illustrates by way of example a voltage level shifter 10 for translating a binary input signal IN_L representing a binary sequence to a binary output signal OUT_H representing the same binary sequence. The input signal is provided by an input voltage varying between a first input voltage level VSS and a second input voltage level VDD, whereas the output signal is provided by an output voltage varying between a first output voltage level VBB and a second output voltage level VPP. The voltage level shifter 10 comprises an input port 12 at which the input signal can be proved, a node 16, and an output port 14 at which the output signal can be provided. The output port 14 is connected to the node 16. The shifter 10 further comprises a supply voltage node 18, connectable to a voltage supply for providing the second output voltage level VPP. A first switch 22 is arranged to couple the supply voltage node 18 to the node 16 and to decouple the supply voltage node 18 from the node 16 based on a voltage at the node 16.

In the example, the first switch 22 is implemented as a P-type MOS (metal-oxide semiconductor) field-effect transistor (FET) having its gate connected to the node 16, its source connected to the supply voltage node 18 and its drain connected to the node 16. However, it will be apparent that other types of switches, such as NMOS, CMOS or bipolar switches may be used as well.

Between the input port 12 and parts of shifter 10 situated, in a signal processing direction, downstream thereof, other elements may be provided. Also between the output port 14 and parts of shifter 10 situated, in a signal processing direction, upstream thereof, other elements may be provided. The shown example, for instance, comprises inverters 32 and 34 respectively situated between the input port 12 and the node 16, and the node 16 and the output port 14. The inverters 32, 34 will not be described in further detail in the following description for the sake of clarity and simplicity.

The voltage level shifter 10 comprises a feedback voltage loop 40 arranged to provide a feedback voltage VFB based on the voltage at the node 16. A second switch 42 is arranged to couple the input port 12 to the node 16 based on a voltage VIN at the input port (input voltage) and the feedback voltage VFB.

In the shown example, the feedback voltage loop 40 is connected to the node 16 for providing the feedback voltage (VFB) based on the voltage at the node 16. However, depending on the specific implementation, the actual voltage at the node 16 may be provided as the feedback voltage or a feedback voltage dependent on and derived from the actual voltage may be provided. In the present example, the feedback voltage loop 40 only comprises a delay unit D having a fixed or tunable delay and the actual voltage is provided. The delay may for example be roughly equal or substantially equal to an intrinsic delay of the first switch 22. However, other elements may be provided in the feedback voltage loop 40. Also, the feedback voltage loop 40 may be implemented without the delay unit D.

In the following, repeated reference will be made to a trigger voltage. Throughout this application, the trigger voltage is either defined as the voltage VIN at the input port minus the feedback voltage VFB or defined as the feedback voltage VFB minus the voltage VIN at the input port. The trigger voltage may accordingly assume positive as well as negative values.

In the present example, the second switch 42 is arranged to couple the input port 12 to the node 16 based on the trigger voltage. In this example, the trigger voltage is defined as VIN minus VFB. The second switch 42 has a positive threshold and is arranged to couple the input port 12 to the node 16 in response to the trigger voltage being above this positive threshold. In the example, the second switch 42 is a PMOS field-effect transistor. It has its gate connected to the feedback voltage loop 40, its source connected to the input port 12, and its drain connected to the node 16. The level shifter 10 further comprises a third switch 46 arranged to couple the input port 12 to the node 16 when the absolute difference of the voltage at the input port and the second output voltage level VPP is above a threshold of the third switch 46. In the example, the third switch 46 is an NMOS field-effect transistor having its gate connected to the supply voltage node 18, its source connected to the input port 12, and its drain connected to the node 16.

Figure 5:
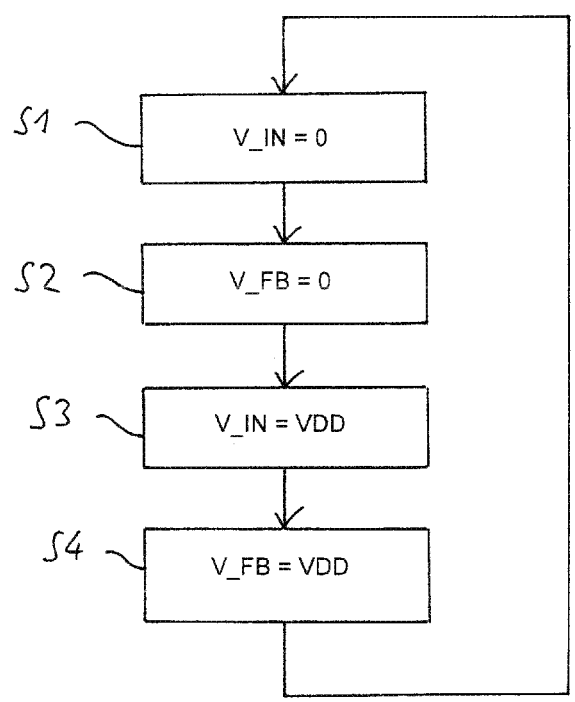
FIG. 5 shows a flow chart illustrating an example of an embodiment of a level shifting method.

Operation of the device 10 shown in FIG. 3 may be explained with additional reference to FIG. 5. In the example, the low voltage levels VSS and VBB are equal and taken as zero (VSS=0, VBB=0). For the ease of explanation, abstraction is again made of the inverters 32, 43. Accordingly, the common source of PMOS 42 and NMOS 46 is considered as the input port, and node 16 is considered as the output port. Equivalently, inverters 32 and 34 may be considered absent. The voltage VIN (input voltage) at the thus defined input port (source of PMOS 42 and NMOS 46) is initially taken to be zero (step S1). NMOS 46 is open while PMOS 22 is closed. The voltage at node 16 is zero. After lapse of the delay of the dealy unit 40, the feedback voltage VFB delivered by the dealy unit 40 and applied at the gate of the PMOS 42 is also zero (step S2). Next, the input voltage VIN is increased. NMOS 46 accordingly closes while PMOS 42 opens. PMOS 22 also opens and the voltage at node 16 increases. At some point in time, depending on the delay of the feedback loop 40, 42, PMOS 42 closes. A leakage current from supply voltage node 18 via node 16 to input port 12 is therefore substantially reduced. A stationary state is reached in which the voltage at the sources of PMOS 42 and NMOS 46 is substantially VDD and the voltage at the drains (i.e. the voltage at node 16) is substantially VPP (step S3). The feedback voltage VFB also tends to VDD (step S4). When the input voltage VIN is reset to zero, NMOS 46 again opens and the cycle is complete (return to step S1).

PMOS 42 thus temporarily connects the input port 12 to the node 16 in response to a rising edge of the input voltage VIN. NMOS 46 connects the input port 12 to the node 16 in response to a falling edge of the input voltage VIN, or (in the present embodiment) in response to the input voltage VIN being below a certain threshold. At each rising edge and at each falling edge one of PMOS 42 and NMOS 46 thus opens and thus allows the input voltage VIN to trigger a state transition of PMOS transistor 22.

The described arrangement combines a short propagation delay and low leakage or DC current. It is based on the basic bufferless fast signal transfer level shifter structure described above with reference to FIG. 2. A logic high level signal transfer is provided by a low voltage domain driver and completed by a high voltage domain handle structure. The additional data dependent feedback structure 40, 42, 46 disconnects the low voltage domain drive after a drive has been completed (e.g. to at least the level of low supply) and leaves a signal held by the handle structure only. The inter-domain DC current which would otherwise flow through the high voltage domain handle structure and the low voltage domain buffer is thereby cut.

The exemplary level shifter circuit shown in FIG. 3 may be used, for example, in multi-voltage multi-power domains in a core logic part of a chip. The difference between VDD and VPP is then typically fairly small, e.g. 0.1 Volts (V) or 0.2 V when the power supply voltage is e.g. 0.9 V to 1.2 V. If the difference between VDD and VPP does not exceed the NMOS threshold voltage (e.g. 0.35 V for 65 nanometer (65 nm) bulk technology or 0.25V for 45 nm SOI technology), the NMOS transistor 46 may be assumed "fully closed" when its source is at voltage level VDD, although some insignificant subthreshold current may exist.

Figure 4:
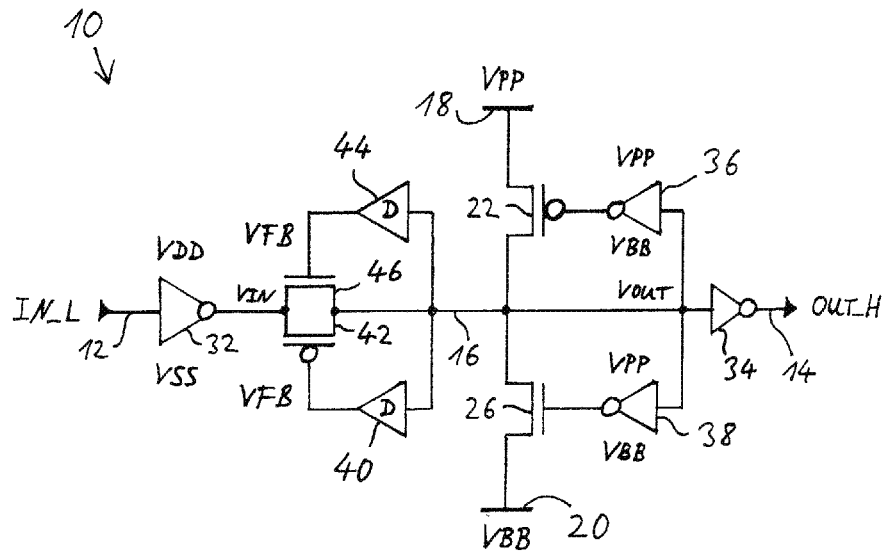
FIG. 4 schematically shows an example of yet another embodiment of a level shifter.

Referring now to FIG. 4, there is represented by way of example a voltage level shifter 10 according to another embodiment. Whereas the embodiment discussed above by way of example with reference to FIG. 3 is mainly intended to operate with VSS=VBB, the embodiment shown in FIG. 4 is intended in particular for an environment in which VSS differs from VBB and VDD differs from VPP. The voltage level shifter 10 comprises a third switch 46 arranged to couple the input port 12 to the node 16 based on the trigger voltage defined above, in a manner quite analogous to the second switch 42. In the example, the trigger voltage is defined as VIN minus VFB. The third switch 46 has a negative threshold and is arranged to couple the input port 12 to the node 16 in response to the trigger voltage being below the negative threshold. The third switch 46 is a field-effect transistor having its gate connected to the feedback voltage loop 40, its source connected to the input port 12, and its drain connected to the node 16. In the example, the transistor 46 is an NMOS transistor (NMOS). The gate of NMOS 46 is connected to node 16 via a dealy unit 44 which is identical or similar to dealy unit 40. PMOS 42 is responsive to rising edges of the output voltage VIN, while NMOS 46 is responsive to falling edges of the output voltage VIN, in the sense that in the event of a rising or falling edge the respective transistor 42 or 46 will open for a duration determined by the delay introduced by the dealy units 40 and 44. Dealy unit 44 is not truly necessary; instead, the gate of NMOS 46 could be connected to the output side of dealy unit 40.

The present embodiment also differs from the one described above with FIG. 3 in that it comprises an additional switch 26 for coupling the second output voltage level VBB to node 16. The additional switch 26 is analogous to the first switch 22. In the present example it is implemented in the form of an NMOS transistor 26 having its gate connected to node 16 via an inverter 38.

Figure 6:
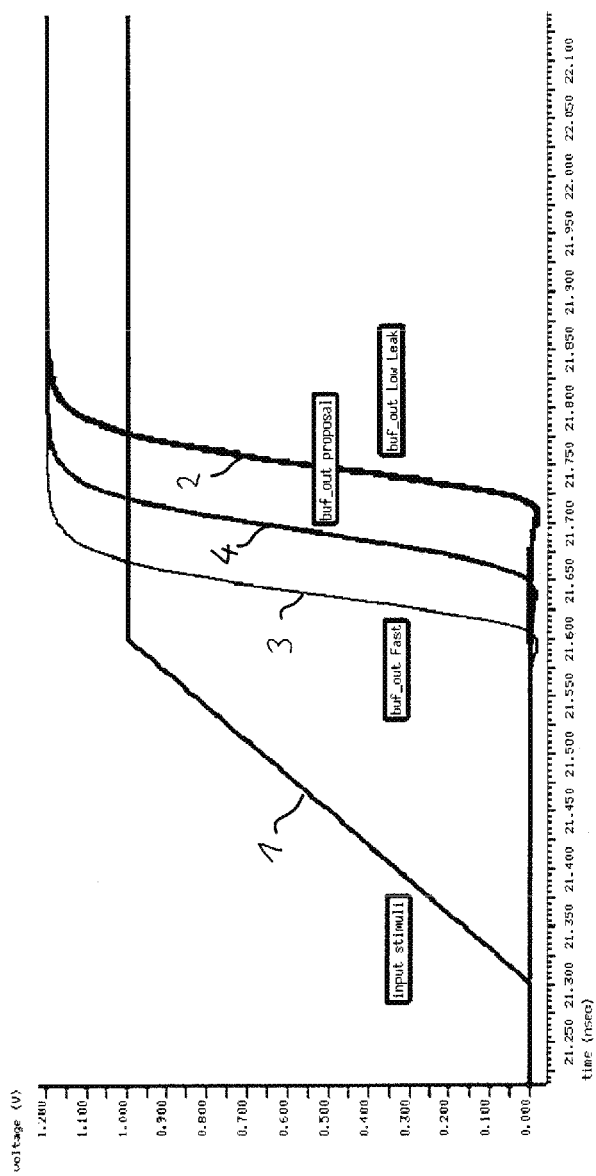
FIG. 6 schematically represents an experimental input signal and resulting output signals.

Referring now to FIG. 6, there is plotted by way of example an input voltage 1 as a function of time. The input voltage 1 is simultaneously fed to three different level shifters, namely, to level shifters as shown in FIGS. 1, 2, and 3. The level shifters were implemented using 65 nm manufacturing technology. Graphs 2, 3 and 4 illustrate the output voltage delivered by the voltage shifter of FIG. 1, FIG. 2 and FIG. 3, respectively. Comparing the rising edge in each of signals 2, 3, and 4 with the rising edge in the input signal 1, the circuit according to FIG. 3 is seen to have a delay intermediate between the delays of the circuits shown in FIGS. 1 and 2.

Figure 7:
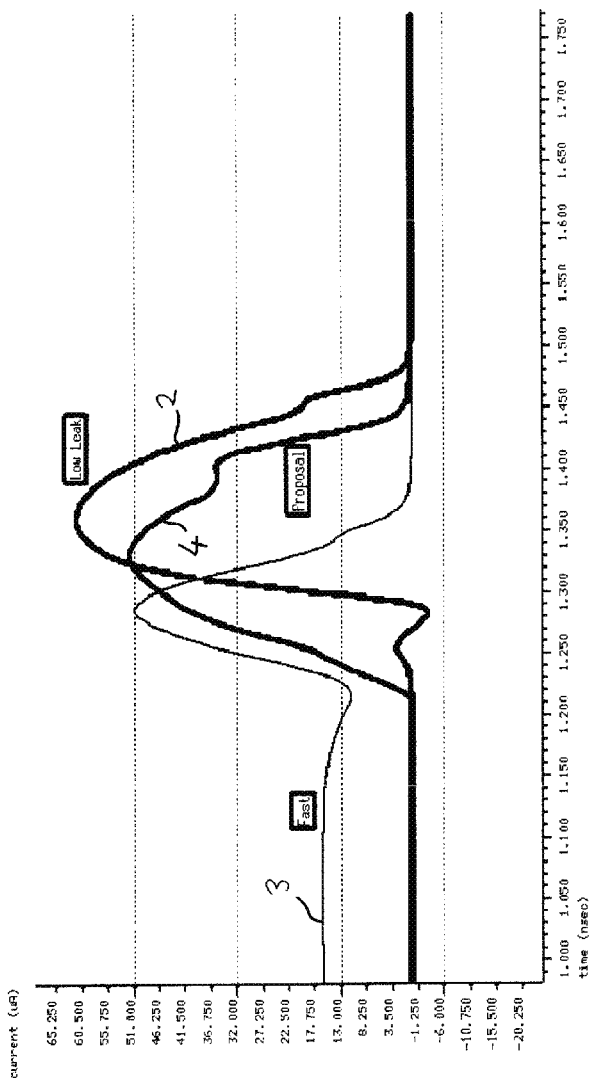
FIG. 7 schematically represents experimentally observed leakage currents.

Leakage currents observed in a related second experiment are represented in FIG. 7 as graphs 2, 3 and 4. A striking feature is the high leakage current (graph 3) of the "fast" device according to FIG. 1 for times less than about 1.15 nanoseconds. This time interval corresponds to a state in which the PMOS transistor 22 in FIG. 2 is open. This leakage current is effectively suppressed in the embodiments according to FIGS. 1 and 3. In all of the three circuits a substantial current is observed during a state transition (rising edge or falling edge).

Figure 8:
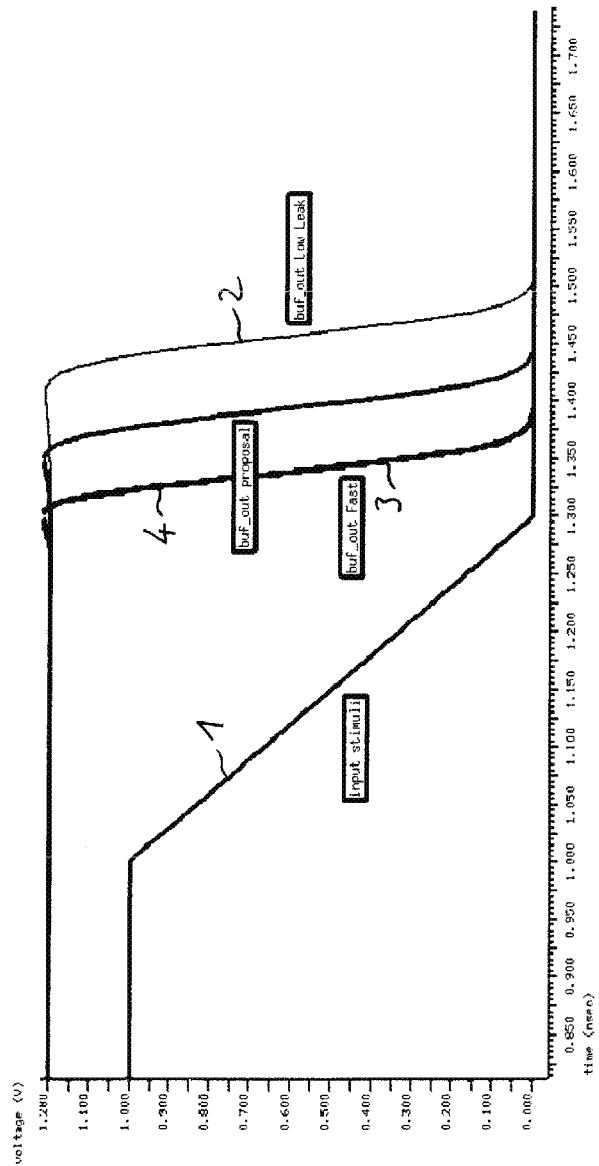
FIG. 8 schematically represents another experimental input signal and resulting output signals.

Plotted in FIG. 8 are the input voltage 1 and the output voltages 2, 3, and 4 as defined in FIG. 7, now for the case of a falling edge. The delays of the output signals 2, 3 and 4 are very similar to those that are observed in the event of a rising edge (see FIG. 6).

In the foregoing specification, the invention has been described with reference to specific examples of embodiments of the invention. It will, however, be evident that various modifications and changes may be made therein without departing from the broader scope of the invention as set forth in the appended claims.

For example, the examples are not limited to the specific types of transistors shown, but may also be implemented in a complementary version, by replacing for example p-type transistors with n-type transistors and vice versa. Furthermore, although the examples show Field Effect Transistors, it will be apparent that other types of devices may be used instead or additionally, such as bipolar switches and other bipolar devices.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the shown circuits are merely illustrative and that alternative embodiments may merge circuit elements or impose an alternate decomposition of functionality upon various circuit elements. Thus, it is to be understood that the architectures depicted herein are merely exemplary, and that in fact many other architectures can be implemented which achieve the same functionality. For example, the second switch 42 and the third switch 46 in FIG. 3 can be implemented as a single circuit achieving the same functionality. As another example, the dealy unit 40 can be merged with the second switch 42.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the entire circuit shown in FIG. 3 may be located on a single integrated circuit. Alternatively, the examples may be implemented as any number of separate integrated circuits or separate devices interconnected with each other in a suitable manner. For example, the coupling structure 40, 42, 46 in FIG. 3 may be implemented as a separate device for being used in conjunction with a voltage level shifter as described with reference to FIG. 2.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A voltage level shifter for translating a binary input signal representing a binary sequence to a binary output signal representing the same binary sequence, the voltage level shifter comprising:
   an input port for receiving the binary input signal as an input voltage varying between a first input voltage level and a second input voltage level;
   a node;
   an output port connected to the node, for outputting the binary output signal as an output voltage varying between a first output voltage level and a second output voltage level;
   a supply voltage node connectable to a voltage supply, for providing the second output voltage level;
   a first switch arranged to couple the supply voltage node to the node and to decouple the supply voltage node from the node based on a voltage at the node;
   a feedback voltage loop connected to the node for providing a feedback voltage based on the voltage at the node; and
   a second switch connected to the feedback voltage loop and arranged to couple the input port to the node based on a trigger voltage, the trigger voltage being one selected from a group consisting of: the voltage at the input port minus the feedback voltage, and the feedback voltage minus the voltage at the input port.

2. The voltage level shifter as set forth in claim 1, wherein the second switch has a positive threshold and is arranged to couple the input port to the node in response to the trigger voltage being above the positive threshold.

3. The voltage level shifter as set forth in claim 1, wherein the feedback voltage loop comprises a delay unit having a fixed or tunable delay.

4. The voltage level shifter as set forth in claim 3, wherein the delay is roughly or substantially equal to an intrinsic delay of the first switch.

5. The voltage level shifter as set forth in claim 1, wherein the first switch is a field-effect transistor having
   a gate connected to the node,
   a source connected to the supply voltage node, and
   a drain connected to the node.

6. The voltage level shifter as set forth in claim 1, wherein the second switch is a field-effect transistor having
   a gate connected to the feedback voltage loop,
   a source connected to the input port, and
   a drain connected to the node.

7. The voltage level shifter as set forth in claim 1, wherein the voltage level shifter comprises a third switch arranged to couple the input port to the node based on a second trigger voltage.

8. The voltage level shifter set forth in claim 7, wherein the third switch has a negative threshold and is arranged to couple the input port to the node in response to the second trigger voltage being below the negative threshold.

9. The voltage level shifter as set forth in claim 7, wherein the third switch is a field-effect transistor having
   a gate connected to the second trigger voltage,
   a source connected to the input port, and
   a drain connected to the node.

10. The voltage level shifter as set forth in any claim 1, wherein the voltage level shifter comprises a third switch arranged to couple the input port to the node in response to the absolute difference of the voltage at the input port and the second output voltage level being above a threshold of the third switch.

11. The voltage level shifter as set forth in claim 10, wherein the third switch is a field-effect transistor having
   a gate connected to the supply voltage node,
   a source connected to the input port, and
   a drain connected to the node.

12. A method for translating a binary input signal representing a binary sequence to a binary output signal representing the same binary sequence, the method comprising:
   providing at an input port an input signal as an input voltage varying between a first input voltage level and a second input voltage level;
   providing a supply voltage of a second output voltage level at a supply voltage node;

providing at an output port connected to a node an output signal as an output voltage varying between a first output voltage level and a second output voltage level;

coupling the supply voltage node to the node and decoupling the supply voltage node from the node based on a voltage at the node;

obtaining a feedback voltage based on the voltage at the node; and coupling the input port to the node using a switch having a negative threshold in response to the feedback voltage being below the negative threshold.

13. The method as set forth in claim 12, wherein the first input voltage level and the first output voltage level are substantially equal.

14. The method as set forth in claim 12, wherein obtaining the feedback voltage comprises obtaining the feedback voltage using a delay unit having a fixed or tunable delay.

15. A voltage level shifter for translating a binary input signal representing a binary sequence to a binary output signal representing the same binary sequence, the voltage level shifter comprising:

an input port for receiving the binary input signal as an input voltage varying between a first input voltage level and a second input voltage level;

a node;

an output port connected to the node, for outputting the binary output signal as an output voltage varying between a first output voltage level and a second output voltage level;

a supply voltage node connectable to a voltage supply, for providing the second output voltage level;

a first switch arranged to couple the supply voltage node to the node and to decouple the supply voltage node from the node based on a voltage at the node;

a feedback voltage loop connected to the node for providing a feedback voltage based on the voltage at the node; and a second switch having a negative threshold and arranged to couple the input port to the node in response to the feedback voltage being below the negative threshold.

16. The voltage level shifter as set forth in claim 15, further comprising a third switch having a positive threshold and arranged to couple the input port to the node in response to a trigger voltage being above the positive threshold.

17. The voltage level shifter as set forth in claim 16, further comprising a second feedback voltage loop connected to the node for providing the trigger voltage.

18. The voltage level shifter as set forth in claim 15, further comprising a third switch arranged to couple the input port to the node, a gate terminal of the third switch connected to the supply voltage node.

19. The voltage level shifter as set forth in claim 15, wherein the feedback voltage loop comprises a delay unit having a fixed or tunable delay.

20. The voltage level shifter as set forth in claim 15, wherein the second switch is a field-effect transistor having a gate connected to the feedback voltage loop, a source connected to the input port, and a drain connected to the node.

* * * * *